United States Patent
Son

(10) Patent No.: US 9,722,209 B2
(45) Date of Patent: Aug. 1, 2017

(54) ORGANIC LIGHT-EMITTING DIODES (OLEDS) WITH HIGH EFFICIENCY AND ITS MANUFACTURING METHOD

(75) Inventor: Se-Hwan Son, Daejeon Metropolitan (KR)

(73) Assignee: LG DISPLAY, CO., LTD., Seoul (KR)

( * ) Notice: Subject to any disclaimer, the term of this patent is extended or adjusted under 35 U.S.C. 154(b) by 778 days.

(21) Appl. No.: 13/120,828

(22) PCT Filed: Sep. 25, 2009

(86) PCT No.: PCT/KR2009/005511
§ 371 (c)(1),
(2), (4) Date: Mar. 24, 2011

(87) PCT Pub. No.: WO2010/036070
PCT Pub. Date: Apr. 1, 2010

(65) Prior Publication Data
US 2011/0180836 A1    Jul. 28, 2011

(30) Foreign Application Priority Data
Sep. 25, 2008  (KR) .......................... 10-2008-0093993

(51) Int. Cl.
*H01L 51/52*  (2006.01)
*H01L 27/32*  (2006.01)
*H05B 33/22*  (2006.01)

(52) U.S. Cl.
CPC ...... *H01L 51/5275* (2013.01); *H01L 27/3283* (2013.01); *H05B 33/22* (2013.01)

(58) Field of Classification Search
USPC ............................... 257/40, 98, 99, E51.019

IPC ............... H01L 27/3283,51/5275; H05B 33/22
See application file for complete search history.

(56) References Cited

U.S. PATENT DOCUMENTS

| | | |
|---|---|---|
| 6,650,045 B1 | 11/2003 | Forrest et al. |
| 2003/0164496 A1 | 9/2003 | Do et al. |
| 2004/0195962 A1 | 10/2004 | Nakamura et al. |
| 2005/0062399 A1 | 3/2005 | Gotoh et al. |
| 2005/0127832 A1* | 6/2005 | Toguchi .............. H01L 51/5275 313/512 |
| 2005/0194896 A1 | 9/2005 | Sugita et al. |
| 2006/0125388 A1 | 6/2006 | Song et al. |
| 2006/0214572 A1 | 9/2006 | Maeda |

(Continued)

FOREIGN PATENT DOCUMENTS

| | | |
|---|---|---|
| CN | 1575056 A | 2/2005 |
| CN | 1653856 A | 8/2005 |

(Continued)

OTHER PUBLICATIONS

Merriam Webster OnLine definition of sandwich. No date.*

(Continued)

*Primary Examiner* — Hrayr A Sayadian
(74) *Attorney, Agent, or Firm* — Dentons US LLP

(57) ABSTRACT

The present invention relates to an organic light emitting device that has a structure which is capable of maximally extracting light generated in the organic light emitting device to the outside. In detail, the organic light emitting device according to the present invention is characterized in that the organic light emitting device includes a high refractive index layer or an electrode that includes a light reuse pattern.

17 Claims, 10 Drawing Sheets

(56) References Cited

U.S. PATENT DOCUMENTS

| | | |
|---|---|---|
| 2007/0012940 A1 | 1/2007 | Suh et al. |
| 2007/0096112 A1 | 5/2007 | Hoshi |
| 2007/0096122 A1 | 5/2007 | Kaneko |
| 2007/0114919 A1 | 5/2007 | Sotoyama |
| 2007/0120136 A1 | 5/2007 | Noda et al. |
| 2008/0018231 A1 | 1/2008 | Hirakata |
| 2008/0093978 A1 | 4/2008 | Mori |
| 2011/0180836 A1* | 7/2011 | Son .................. H01L 27/3283 257/98 |

FOREIGN PATENT DOCUMENTS

| | | |
|---|---|---|
| JP | 2838063 | 10/1998 |
| JP | 2000-268980 | 9/2000 |
| JP | 2000-268980 A | 9/2000 |
| JP | 2003-077680 | 3/2003 |
| JP | 2004-296423 | 10/2004 |
| JP | 2004-296423 A | 10/2004 |
| JP | 2004-311419 A | 11/2004 |
| JP | 2005-327522 | 11/2005 |
| JP | 2005327522 A | 11/2005 |
| JP | 2006173109 A | 6/2006 |
| JP | 2007-080579 | 3/2007 |
| JP | 2007-080579 A | 3/2007 |
| JP | 2007-095326 A | 4/2007 |
| JP | 2007-258113 A | 10/2007 |
| JP | 2008060038 A | 3/2008 |
| JP | 2008-112592 A | 5/2008 |
| JP | 2008108439 A | 5/2008 |
| KR | 10-0590237 | 11/2006 |
| KR | 10-068505 | 2/2007 |
| KR | 10-0685805 | 2/2007 |
| KR | 10-0685805 B1 | 2/2007 |
| KR | 100685805 | 2/2007 |
| KR | 10-0760967 | 9/2007 |
| KR | 10-20070090749 A | 9/2007 |
| WO | WO 2007/106770 | 9/2007 |
| WO | WO-2010036070 * | 4/2010 |

OTHER PUBLICATIONS

Office Action of Japanese Patent Office in Application No. 2011-528945, dated Jul. 23, 2013.

Office Action of Chinese Patent Office in Application No. 200980137864.5, dated Jun. 4, 2013.

Office Action of European Patent Office in Application No. 09816463.5 dated, May 2, 2013.

Office Action of European Patent Office in Appl'n No. 09816463.5, dated Apr. 30, 2014.

Office Action of Japanese Patent Office in Appl'n No. 2011-528945, dated Apr. 17, 2012.

* cited by examiner

[Figure 1]
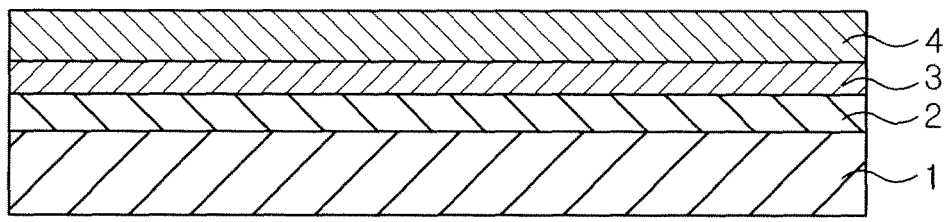
[Figure 2]
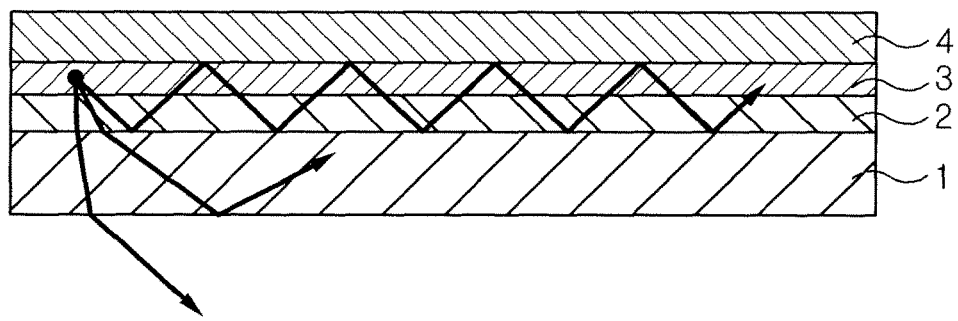
[Figure 3]
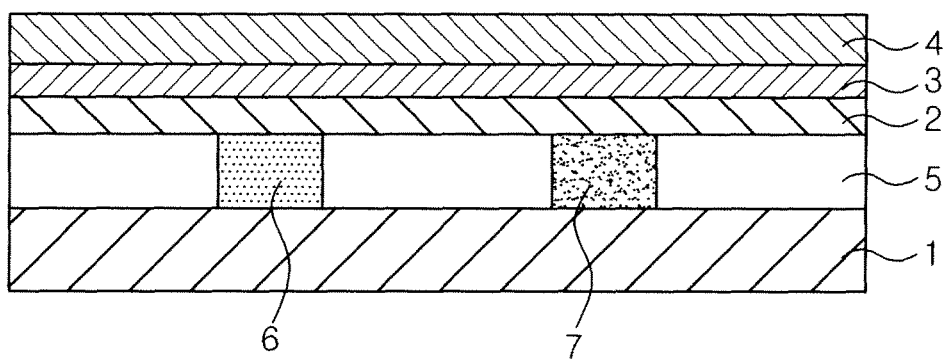

[Figure 4]
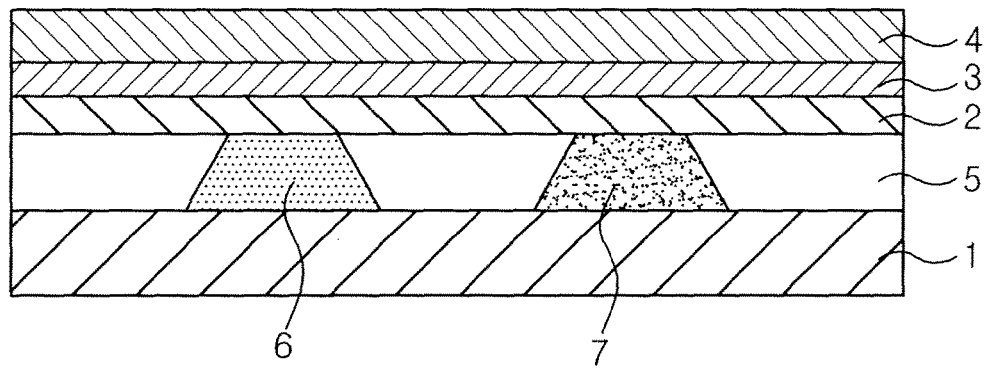
[Figure 5]
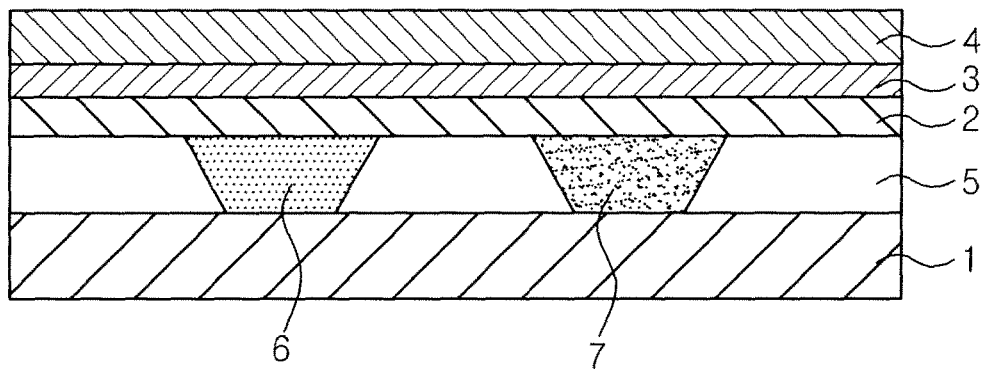
[Figure 6]
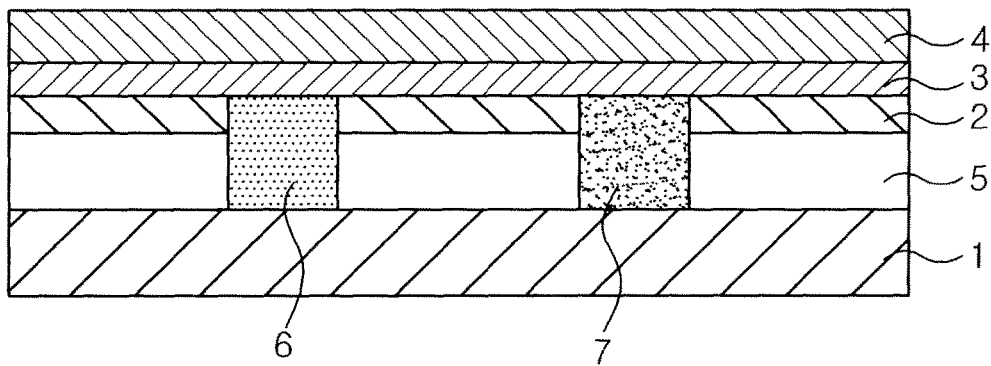

[Figure 7]
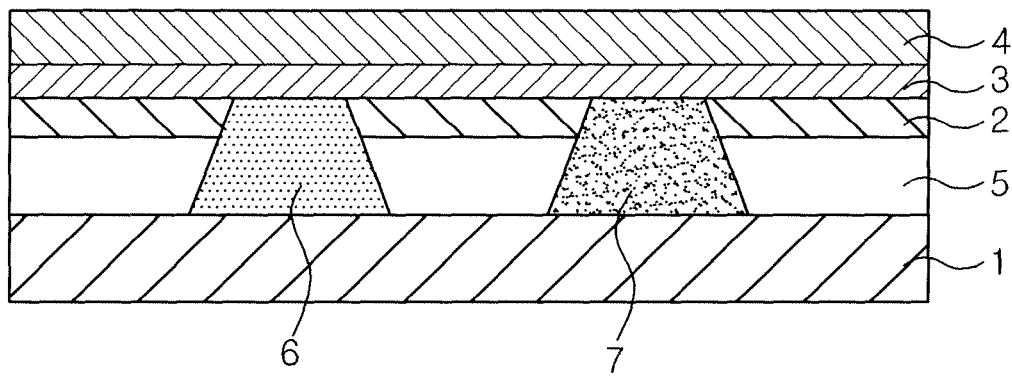
[Figure 8]
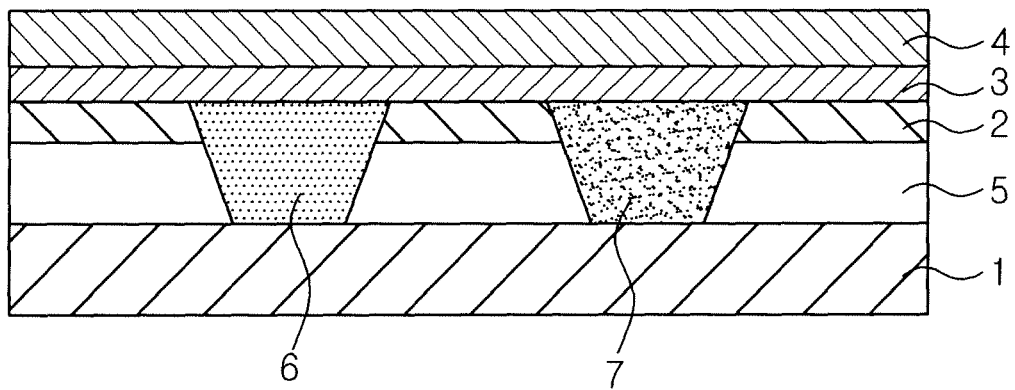
[Figure 9]
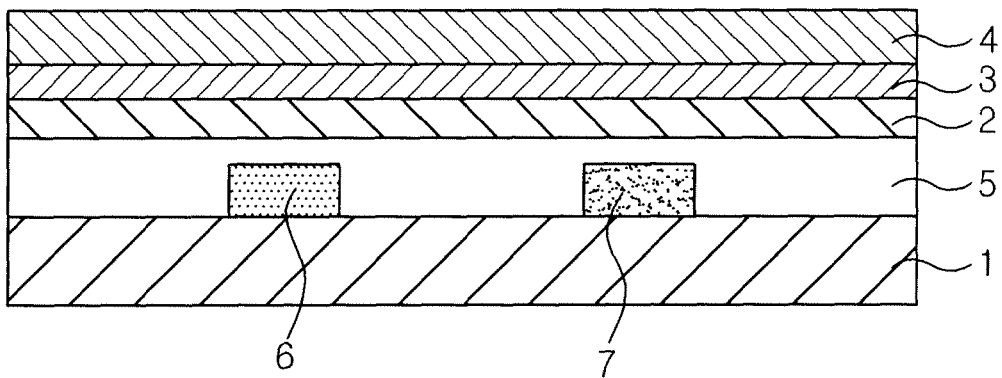

[Figure 10]
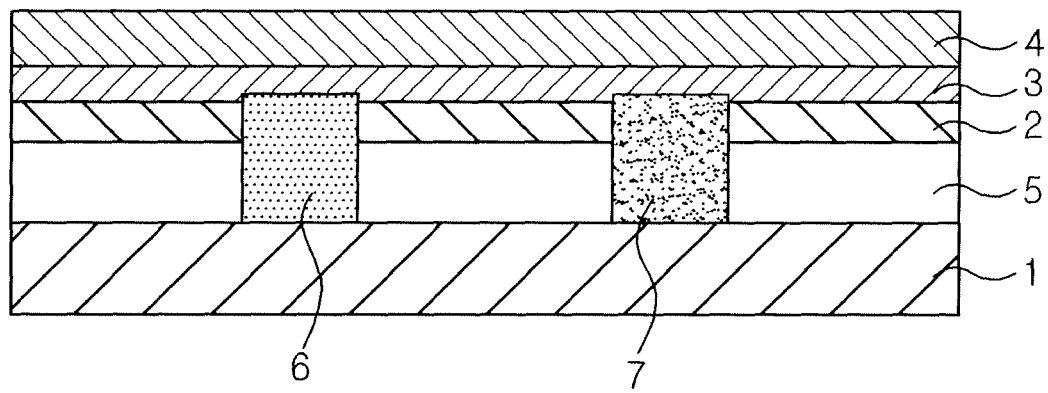
[Figure 11]
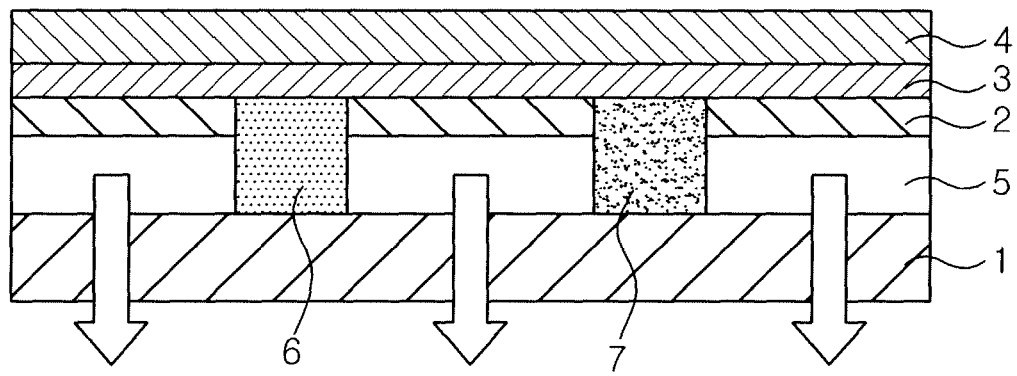
[Figure 12]
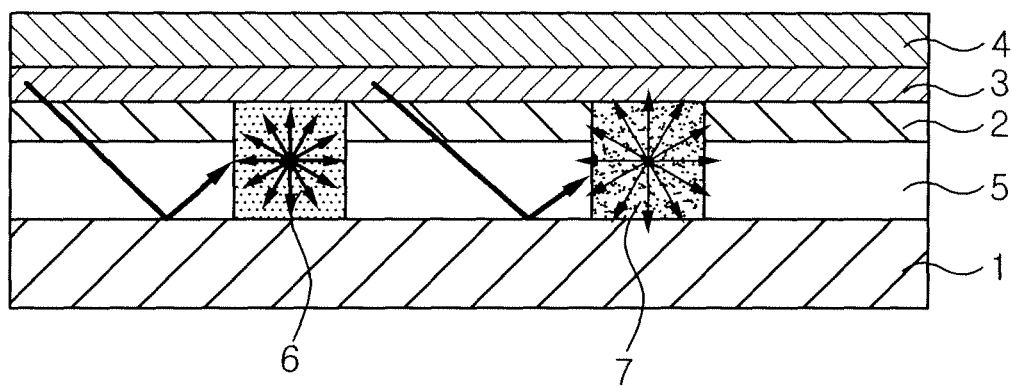

[Figure 13]
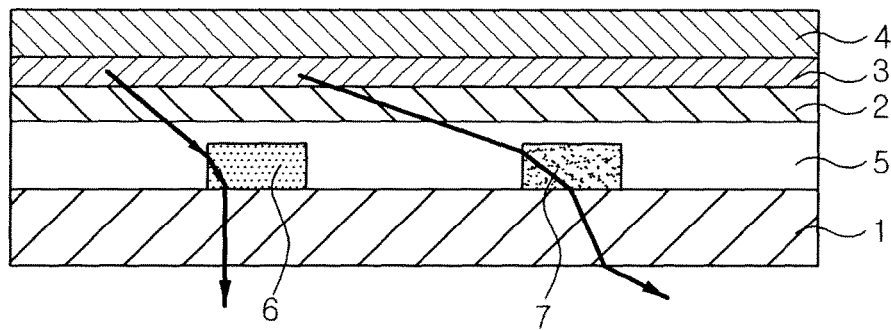
[Figure 14]
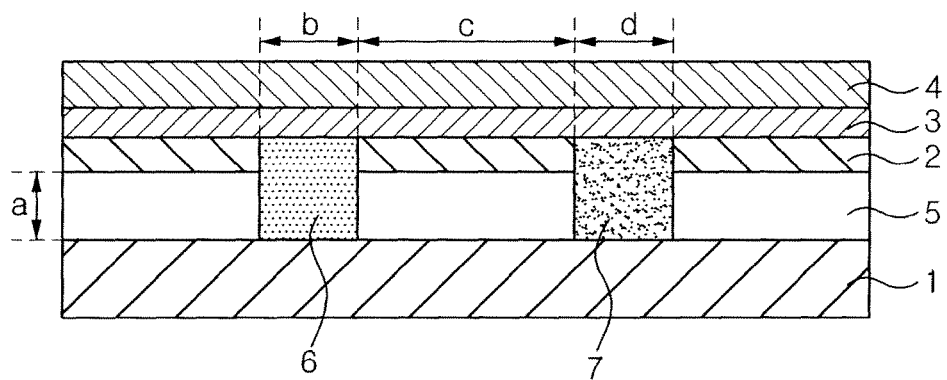
[Figure 15]
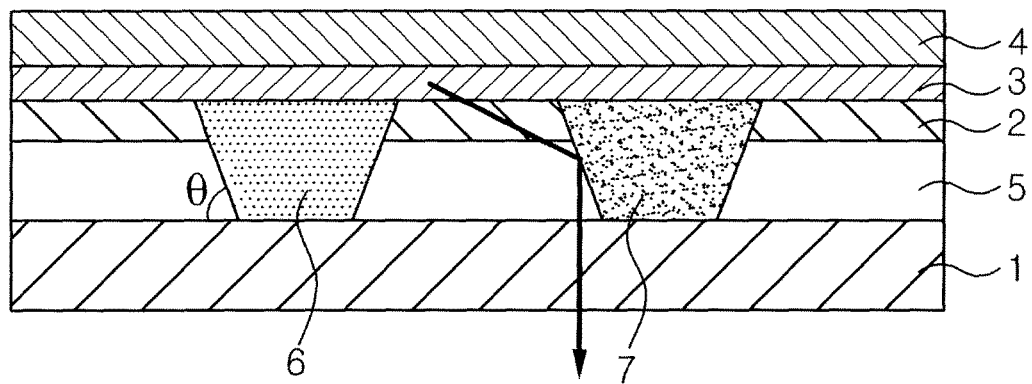

[Figure 16]
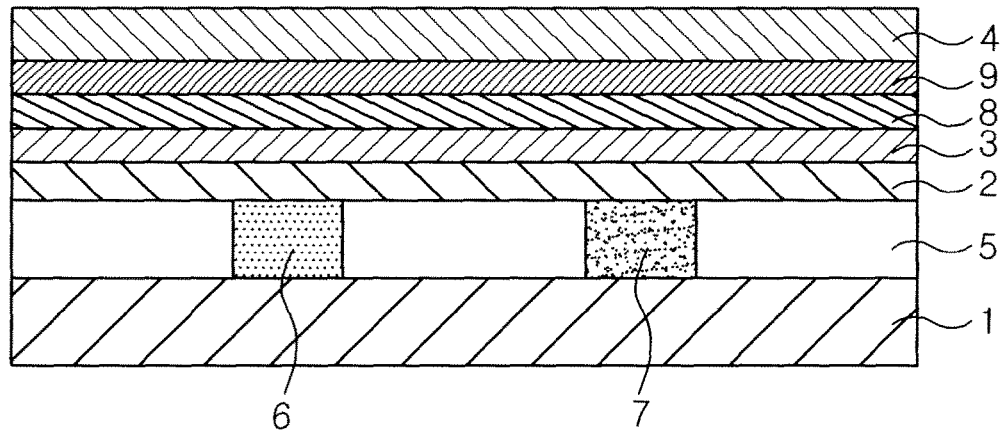
[Figure 17]
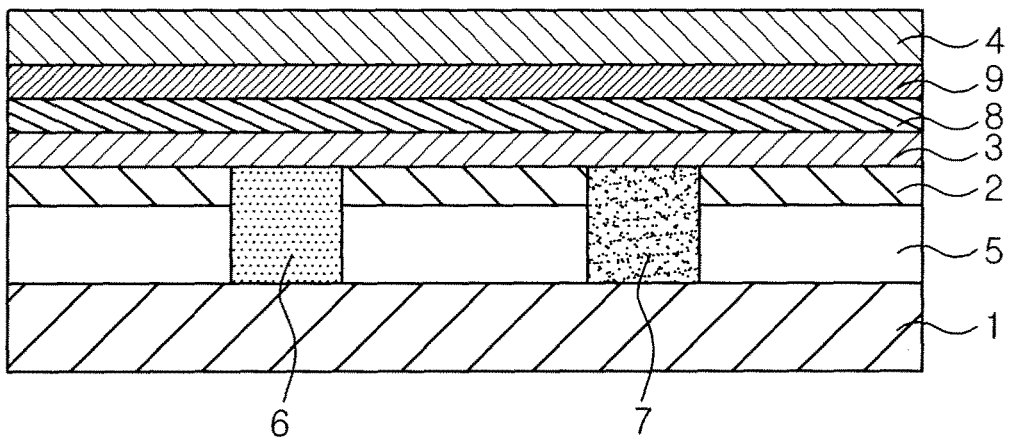

[Figure 18]
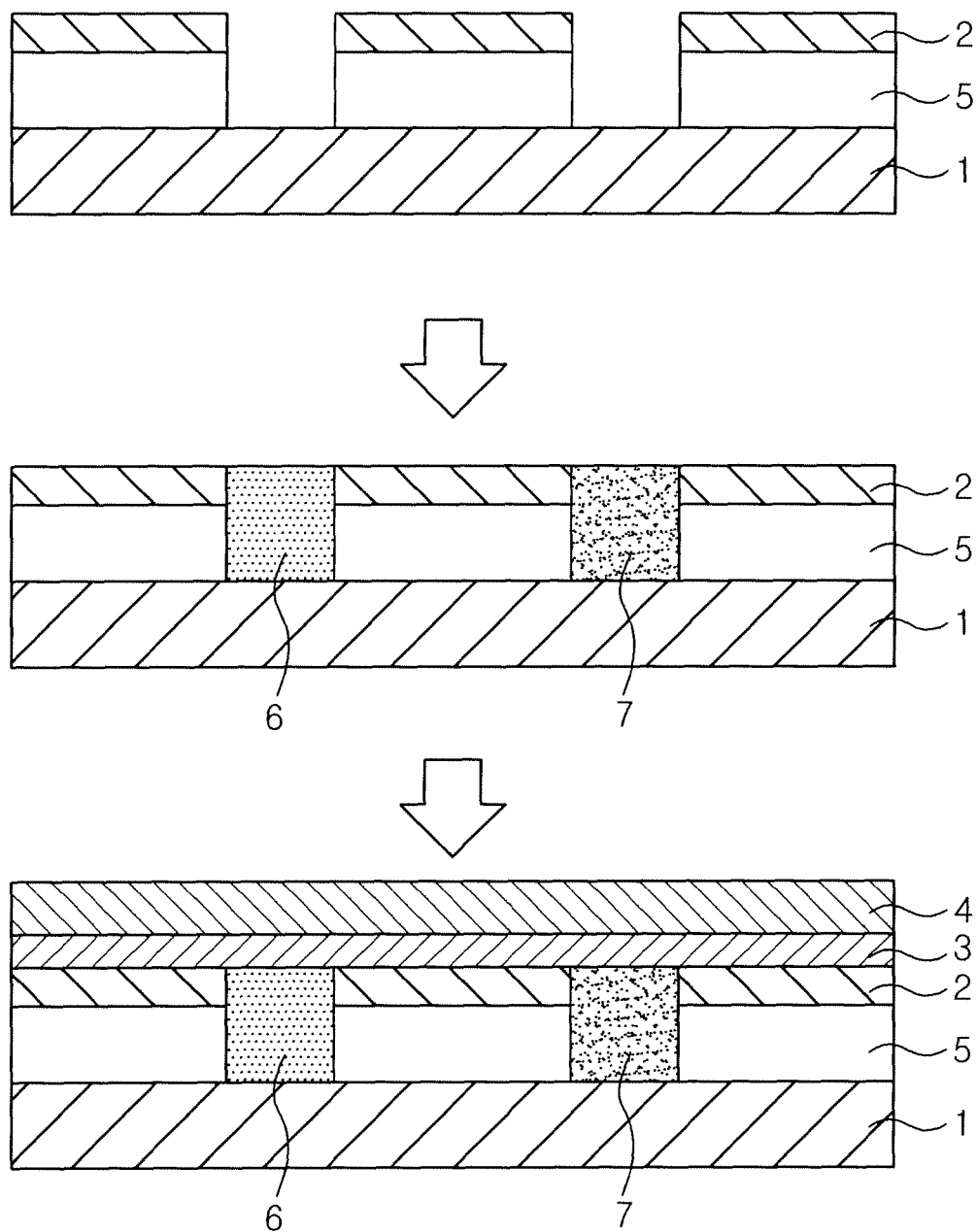

[Figure 19]
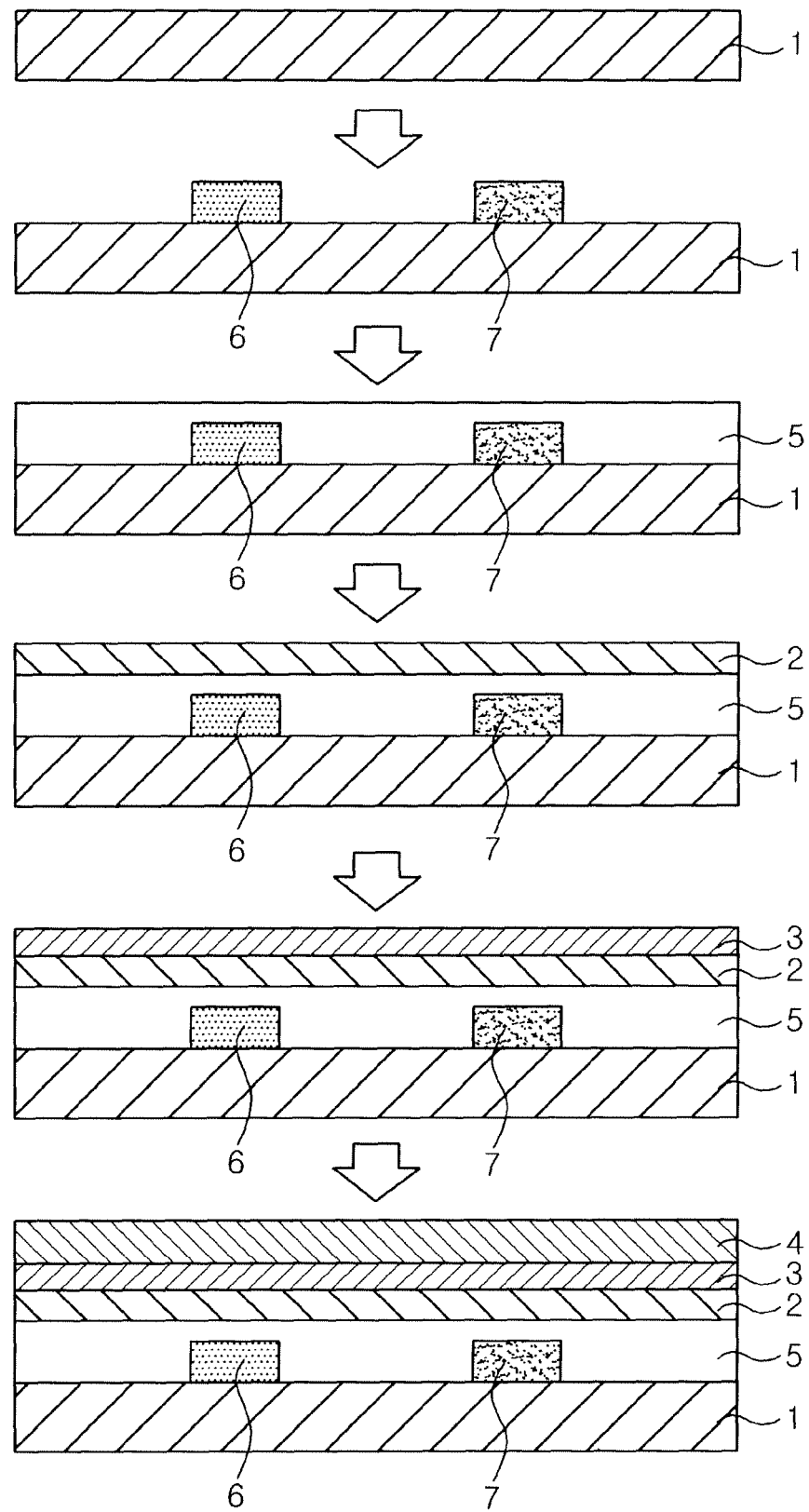

[Figure 20]
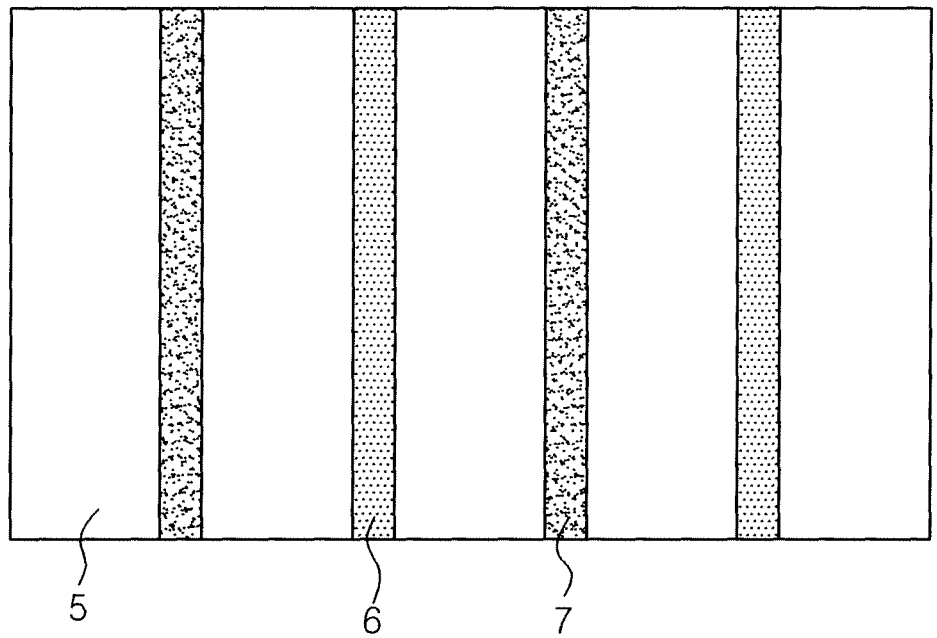
5  6  7
[Figure 21]
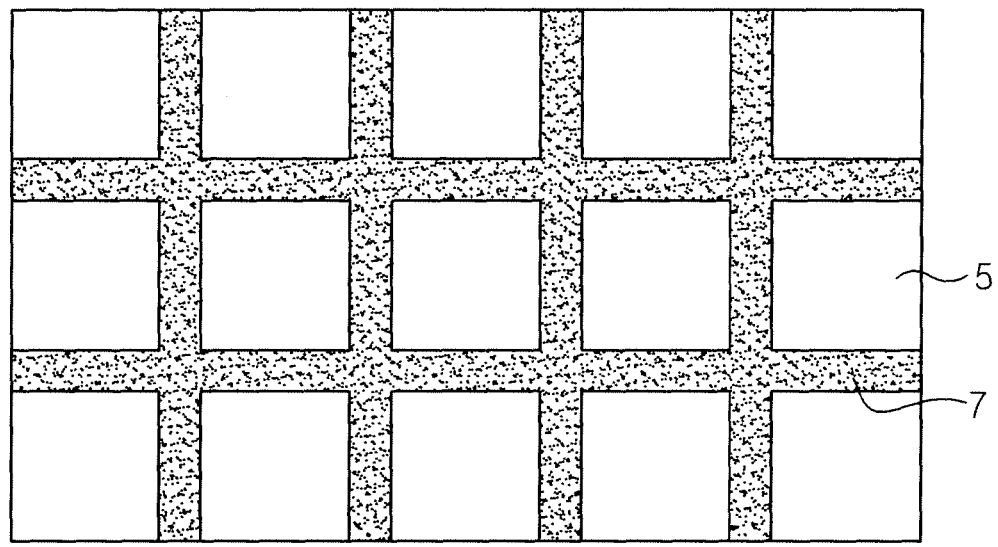
5
7

[Figure 22]
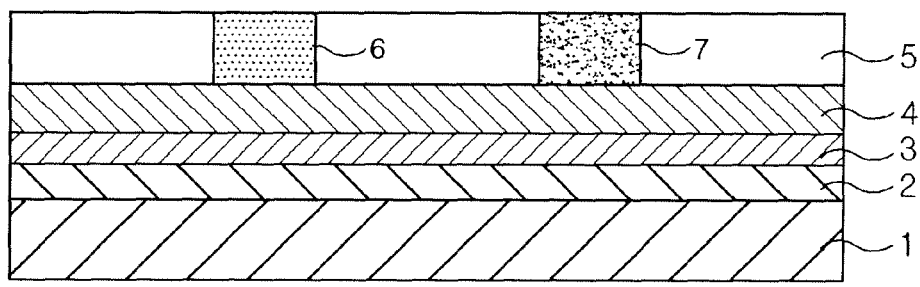
[Figure 23]
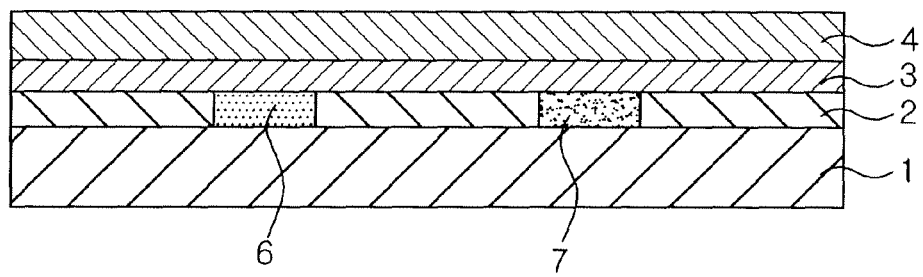
[Figure 24]
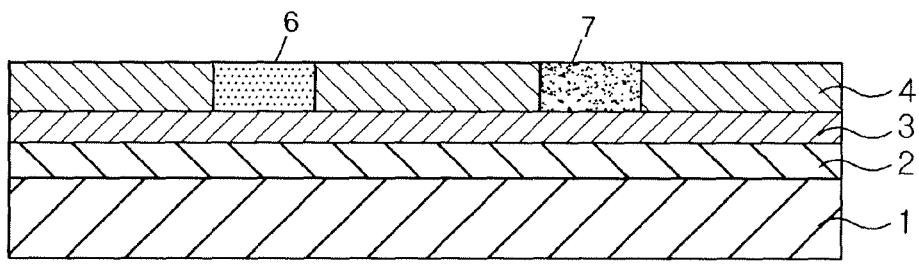

ORGANIC LIGHT-EMITTING DIODES (OLEDS) WITH HIGH EFFICIENCY AND ITS MANUFACTURING METHOD

TECHNICAL FIELD

This application claims the priority to PCT/KR2009/005511 filed on Sep. 25, 2009 and Korean Patent Application No. 10-2008-0093993 filed on Sep. 25, 2008, all of which are hereby incorporated by reference in their entirety. The present invention relates to an organic light emitting device and a method for manufacturing the same. More particularly, the present invention relates to an organic light emitting device that has excellent emission efficiency of light generated in an organic material layer and a method for manufacturing the same.

BACKGROUND ART

An organic light emitting phenomenon means a phenomenon for converting electric energy into light energy by using an organic material. That is, when an appropriate organic material layer is disposed between an anode and a cathode, if a voltage is applied between two electrodes, a hole is injected into the organic material layer at the anode, and an electron is injected into the organic material layer at the cathode. When the injected hole and electron meet each other, exciton is formed, and light is emitted when the exciton falls to the bottom state again.

In recent years, researches to manufacture displays or light sources by using organic light emission have been actively performed. In addition, in order to manufacture an effective organic light emitting device, a study for depositing an organic material layer from a single layer to a multilayered structure has been made. Most organic light emitting devices that are currently used have a structure in which an electrode and an organic material layer are planarily deposited, and among them, as shown in FIG. 1, an organic light emitting device that has a multilayered structure in which an organic material layer 3 including multilayers such as a hole injection layer, a hole transfer layer, a light emitting layer on a substrate 1 and an electron transfer layer and electrodes 2 and 4 are planarily deposited are used as the most representative device. In the application of the organic light emitting device, an increase in light emission efficiency has a very important meaning in respects to competition to another technology. In the case of a flat display, in addition to issue in respects to high-quality image, it is seriously competitive in conjunction with LCD in terms of power consumption, and lighting is competitive in conjunction with LED (light emitting diode) in terms of light emission efficiency.

If electrons and holes are injected into an organic light emitting device by applying voltages to the organic light emitting device having a planar structure, they are recombined with each other in the light emitting layer to emit light. At this time, light that is generated in the light emitting layer may travel through the following different two paths by a difference in refractive index in each layer. That is, there are a case of when light is emitted to the outside of the device, and a case of when total reflection occurs at the interface between the transparent substrate and the air layer or at the interface between the transparent substrate and the transparent electrode, such that light is confined in the device (FIG. 2). At this time, the quantity of light that is capable of being emitted to the outside of the device is $1/2n^2$ or less (n is the refractive index of the organic material layer) of light that is generated in the light emitting layer. If the refractive index of the organic material layer is 1.7, about 17% or less of generated light may be emitted to the outside of the organic light emitting device.

By the more detailed analysis, the total reflection does not exist only at the interface between the transparent substrate and the air layer, but it is known that the total reflection frequently occurs at the interface between the transparent electrode having the relatively higher refractive index than that of the transparent substrate and the transparent substrate. In general, the refractive index of the glass substrate is in the range of 1.5 to 1.6, but in the case of the ITO (indium tin oxide) that is the transparent anode commonly frequently used, since the refractive index is in the range of 1.8 to 2.1, the total reflection occurs at the interface between the glass substrate and the transparent anode. The angle at which the total reflection starts to occur is referred to as a critical angle of the total reflection, and the angle may be represented by the equation relating to the refractive index at the interface between the adjacent two layers, that is, $\theta_C = \sin^{-1}(n_2/n_1)$. Herein, $n_2$ is a media having the relatively low refractive index, and $n_1$ is a media having the relatively high refractive index.

In order to emit light in a more quantity to the outside of the organic light emitting device while the above problems are overcome, an effort for manufacturing an organic light emitting device that has a structure including a layer that is not flat unlike the organic light emitting device as shown in FIG. 1, that is, a non-planar structure has been made. However, a structure that is capable of significantly improving light emission efficiency has not yet been developed.

DISCLOSURE

Technical Problem

It is an object of the present invention to provide an organic light emitting device that has a structure which is capable of maximally extracting light generated in an organic light emitting device to the outside. In particular, it is an object of the present invention to provide an organic light emitting device that has a structure which is capable of maximally extracting light totally reflected between a transparent electrode and a transparent substrate to the outside and high light efficiency.

Technical Solution

In order to accomplish the above objects, the present invention provides an organic light emitting device which includes a substrate; a first electrode that is disposed on the substrate; one or more organic material layers that include a light emitting layer disposed on the first electrode; a second electrode that is disposed on the organic material layer; and a high refractive index layer that is provided on at least one side of a lower portion of the first electrode and an upper portion of the second electrode, wherein the high refractive index layer includes a light reuse pattern.

In addition, the present invention provides an organic light emitting device which includes a substrate; a first electrode that is disposed on the substrate; and one or more organic material layers that include a light emitting layer disposed on the first electrode; and a second electrode that is disposed on the organic material layer, wherein at least one of the first electrode and the second electrode includes a light reuse pattern, and the electrode that includes the light reuse pattern has light transmissivity property.

The organic light emitting device according to the present invention includes an organic light emitting device of a single layer structure that includes only one light emitting unit including a light emitting layer between the first electrode and the second electrode, and an organic light emitting device of a stack structure that includes two or more light emitting units. In the organic light emitting device of the stack structure, an intermediate conductive layer or a charge generating layer may be provided between layered light emitting units.

The organic light emitting device according to the present invention may have a normal structure in which the first electrode is the anode and the second electrode is the cathode, or an inverted structure in which the first electrode is the cathode and the second electrode is the anode. The first electrode and the second electrode may be made of different materials, or the same material.

The organic light emitting device according to the present invention may be provided with a Thin film transistor that drives an organic light emitting device between the substrate and the first electrode, between the substrate and the light reuse pattern, or between the substrate and at least a portion of the first electrode and the substrate and at least a portion of the light reuse pattern.

Advantageous Effects

In the organic light emitting device according to the present invention, among lights emitted in the light emitting layer disposed between two opposite electrodes, light that is capable of being converted into heat by absorbing light before light is confined in the device or emitted to the outside by the total reflection is maximally emitted to the outside of the device, such that a light extraction effect of the organic light emitting device is maximized. In particular, the light extraction efficiency may be maximized by reusing light confined in the device by the total reflection between the transparent electrode and the transparent substrate.

In addition, according to the present invention, since forming of the light reuse pattern that has a three dimensional structure capable of ensuring light extraction effect may be implemented by using a printing method and the like on the substrate, it is easy to actually implement it in views of industry.

In addition, a disadvantage of re-reflection of light capable of being emitted to the atmosphere through the substrate by controlling the ratio of the patterned portion and non-patterned portion by the light reuse pattern and/or optimizing the height of the light reuse pattern is solved, and the light efficiency increase is maximized by selectively reusing light total reflected.

DESCRIPTION OF DRAWINGS

FIG. 1 illustrates a structure of a known organic light emitting device;

FIG. 2 illustrates a path of light that is total reflected and becomes extinct in the known organic light emitting device;

FIGS. 3 to 10 illustrate a structure of an organic light emitting device according to a first embodiment of the present invention;

FIGS. 11 to 13 illustrate a path of light that is emitted in the organic light emitting device according to the present invention;

FIG. 14 is a view that illustrates the size of the light reuse layerof the organic light emitting device according to the present invention;

FIG. 15 illustrates a path of light that is emitted in the organic light emitting device according to the present invention;

FIGS. 16 to 17 illustrate a structure of an organic light emitting device that includes two light emitting units according to the present invention;

FIGS. 18 and 19 illustrate a manufacturing process of the organic light emitting device according to the present invention;

FIGS. 20 and 21 illustrate the pattern form of the horizontal section of the high refractive index layer and the light reuse pattern of the organic light emitting device according to the present invention;

FIG. 22 illustrates a structure of an organic light emitting device according to a second embodiment of the present invention;

FIG. 23 illustrates a structure of an organic light emitting device according to a third embodiment of the present invention; and FIG. 24 illustrates a structure of an organic light emitting device according to a fourth embodiment of the present invention.

BEST MODE

Hereinafter, the present invention will be described in detail.

In general, in an organic light emitting device, the thickness of the organic material that exists between two electrodes is 200 nm or less and the transparent electrode has a thickness of 200 nm or less. Meanwhile, it is known that the reflection ratio of the electrode including aluminium generally used is about 93%, and ITO or IZO used as the transparent electrode has absorptivity of 5% or more. Therefore, in the case of when the substrate is formed of glass, the electrode that is contacted with the substrate is an ITO transparent electrode, and the opposite electrode is an aluminium electrode, total reflection occurs between the ITO transparent electrode that has relatively higher refractive index than glass and the glass substrate. As shown in FIG. 2, a photon that is total reflected is absorbed by ITO and aluminium while a total reflection process is repeated, and converted into heat.

Whenever the photon causes the total reflection, it is assumed that it is absorbed in ITO and aluminium in the intensity of 10%, about 40% of photon is absorbed by five times of total reflection. In the case of when the thickness of the layer where the total reflection occurs is 0.4 micrometers and the angle of the total reflection is 45°, a distance of light traveling by one total reflection in a horizontal direction is about 0.8 micrometers.

Therefore, until the photon that is formed at the center of the organic light emitting device that has the dimension of 50×50 micrometers is total reflected and discharged through a side of the substrate to the outside of the device, 30 or more total reflections (25 micrometers/0.8 micrometers) are carried out.

Accordingly, most total reflected light is converted into heat, and the generated heat may cause a problem in stability of the device. Therefore, in order to maximally extract the photon that is total reflected and becomes extinct in a heat form to the outside, it should be emitted to a side of the substrate after minimum total reflection is performed by minimizing the size of the substrate. However, in genrearl, since glass or plastic substrate of which thickness is in the range of tens to hundreads microns is used, it is difficult to practically manufacture the device that has the length and breadth in the range of several microns to tens microns and it is difficult to practically manufacture the device because of problems such as connection of the electrodes and packaging.

In the present invention, in the case of when light emitting efficiency is increased and total reflected light reaches the light reuse pattern by minimizing the number of total reflection regardless of the area of the substrate, it is reused by using methods such as scattering, absorption, light re-emitting, low refraction, reflection or the like, thereby improving photon efficiency of the device. Thereby, the total intensity of light emitted from the device to the outside may be increased. This method is a light extraction method that is more effective as compared to a known method which suppresses only total reflection between the substrate and the air layer.

In the related art, instead of maintaining the interface that is formed between the substrate having the relatively low refractive index and the anode having the relatively high refractive index as a flat surface, an effort that reduces total reflection at the interface by introducing shapes such as unevenness between the substrate and the anode has been made. However, in the above effort, since an ultramicro photolithography process that is used in a semiconductor process is required or a method for patterning the glass substrate which is difficult to be relatively patterned is used, practical use thereof has a significant limit. In addition, in the above effort, most of light traveling toward the substrate in a direction that is capable of extracting it to the outside is total reflected between the substrate and the air layer by the shape such as unevenness, such that a negative effect of not emitting it occurs, thereby lowering the effect.

However, in the present invention, all generated light is not absorbed, re-emitted, or scattered, but light that is generated at an angle of capable of extracting light to the outside is extracted to the outside while only light that is total reflected therein is reused, thereby maximizing the light extraction efficiency. The above selective reusing of light may be maximized by controlling the ratio of the portion that is patterned with the light reuse pattern and the portion that does not have the pattern or the height of the light reuse pattern.

In addition, in the present invention, since the light reuse pattern may be formed on the substrate by using a printing method and the like, a manufacturing method may be easily performed, such that a process cost is lowered, thereby improving economic efficiency.

In the present invention, the light reuse pattern may be formed in a pattern that has any one function selected from scattering, absorption, and re-emission, light refraction and reflection, but two or more functions of scattering, absorption, and re-emission, light refraction and reflection may be combined with each other and applied thereto. For example, at least a portion of the light reuse pattern and the residual portion may have different functions selected from the above functions or the light reuse pattern may have two or more functions.

The present invention provides n organic light emitting device that includes a substrate; a first electrode that is disposed on the substrate; one or more organic material layers that include a light emitting layer disposed on the first electrode; a second electrode that is disposed on the organic material layer; and a high refractive index layer that is provided on at least one side of a lower portion of the first electrode and an upper portion of the second electrode, wherein the high refractive index layer includes a light reuse pattern. Hereinafter, a detailed embodiment of the present invention will be described.

The first embodiment of the present invention provides an organic light emitting device that includes a substrate; a first electrode that is disposed on the substrate; one or more organic material layers that include a light emitting layer disposed on the first electrode; a second electrode that is disposed on the organic material layer, wherein the substrate and the first electrode have the light transmissivity property, the high refractive index layer is disposed between the substrate and the first electrode, and the high refractive index layer includes the light reuse pattern.

In the case of when the substrate and first electrode have the light transmissivity property, the light extraction efficiency of the device may be improved by the high refractive index layer and light reuse pattern that are disposed between the substrate and the first electrode. In this embodiment, the second electrode may have the light transmissivity property. Herein, the light transmissivity property means that the degree of transmission in respects to the wavelength of light that is emitted in the light emitting layer is 30% or more, preferably 50% or more, and more preferably 80% or more, and more preferably 90% or more.

The substrate is not particularly limited as long as it is a material that has the light transmissivity property and is used in the art, and the glass or plastic substrate or the film may be used.

The first electrode is not particularly limited as long as it is an electrode material that has the light transmissivity property and is used in the art. For example, the first electrode may be formed of a conductive oxide such as ITO (indium tin oxide), and IZO (indium zinc oxide), and aluminium, calcium, magnesium, silver, cesium (Cs), lithium or alloys that include them may be used in a thin film form that has the light transmissivity property. The first electrode may serve as the anode or the cathode.

The light reuse pattern is provided in the high refractive index layer to reuse light that is total reflected at the interface between the substrate and the first electrode and emit light to the outside of the device.

In a thickness direction of the high refractive index layer, the light reuse pattern may be disposed at the middle part of the high refractive index layer, or may be biasedly disposed at the upper portion or the lower portion of the high refractive index layer.

For example, the light reuse pattern may be formed in a structure that extends from the interface between the high refractive index layer and the substrate through the high refractive index layer to the interface between the high refractive index layer and the first electrode. The above structure is shown in FIG. 3. In FIG. 3, reference numeral 1 is a substrate, reference numerals 2 and 4 are a first electrode and a second electrode, respectively, reference numeral 3 is an organic material layer, reference numeral 5 is a high refractive index layer, and reference numerals 6 and 7 are a light reuse pattern. At this time, the interface between the light reuse pattern and the high refractive index layer may be vertical in respects to the substrate, but may be maintained at a predetermined angle clockwise in respects to the surface of the substrate. For example, the interface may have the angle that is selected within the range of angle of 10° to 170° and preferably 30° to 150° clockwise in respects to the surface of the substrate. This angle is naturally formed during the process. FIGS. 4 and 5 illustrate the case of when the interface between the light reuse pattern and the high refractive index layer has an inclined angle in respects to the substrate.

The light reuse pattern may have a structure that extends to the inside of the first electrode in addition to the high refractive index layer. FIGS. 6 to 8 illustrate a structure in which the light reuse pattern is formed between the high refractive index layer and the first electrode. In FIGS. 6 to 8, the light reuse pattern extends from the interface between the high refractive index layer and the substrate to the interface between the first electrode and the organic material layer, but it is not limited to the above structure. The light reuse pattern may be contacted or not contacted with the interface between the high refractive index layer and the substrate. In addition, the light reuse pattern may be contacted or not contacted with the interface between the first electrode and organic material layer. In addition, the light reuse pattern may be contacted or not contacted with the interface between the high refractive index layer and the first electrode. In addition, the light reuse pattern may have a structure that extends through the interface between the first electrode and organic material layer to the inside of the organic material layer.

FIG. 9 illustrates a structure in which the light reuse pattern is disposed from the interface between the high refractive index layer and the substrate to the middle thickness of the high refractive index layer. FIG. 10 illustrates a structure in which the light reuse pattern extends through the interface between the first electrode and organic material layer to the inside of the organic material layer.

It is preferable that the height of the light reuse pattern is 10% or more and less than 500% of the thickness of the high refractive index layer, and it is more preferable that the height is 20 to 90% of the thickness of the high refractive index layer. It is preferable that the interval between the light reuse pattern and the electrode is 90% or less of the thickness of the high refractive index layer, and it is more preferable that the interval between the light reuse pattern and the electrode is 80% or less of the thickness of the high refractive index layer.

In a horizontal direction of the high refractive index layer, it is preferable that the light reuse pattern is uniformly distributed in the high refractive index layer. The light reuse pattern can increase light extraction efficiency of the device, such that the shape and the dimension thereof are not particularly limited.

In the present invention, it is preferable that the area of the patterned portion of the light reuse pattern is 5% to 90% of the entire area of the substrate, and it is more preferable that the area of the patterned portion of the light reuse pattern is 10 to 60% of the entire area of the substrate. In addition, the light reuse pattern may be a random pattern, or a regular repeated pattern.

The light reuse pattern may be made of a single material, but is made of two or more materials. In the case of when it includes two or more materials, two or more materials may be included in one area, or two or more areas that each includes one material may be included. In the high refractive index layer, the two or more light reuse pattern shapes may be included. In the case of when two or more light reuse pattern shapes are included, in each pattern shape, at least one of the dimension such as the length, the width, the height and the like, the shape and constitution materials may be different. The light reuse pattern may be disposed in a regular pattern in the high refractive index layer or may be disposed in an irregular pattern.

The light reuse pattern may serve to reuse light that is total reflected by including a material scattering light entering by the total reflection. In order to effectively reuse light that is total reflected by using the scattering of light, it is preferable that the material constituting the light reuse pattern is composed of one or more components. For example, the light reuse pattern may be a pattern in which materials having different refractive indexes are mixed with each other, a pattern in which densities of the materials are spatially different from each other in the pattern, a pattern in a polycrystal state, or a pattern in which the high refractive index particles are dispersed in the material having the relatively small refractive index. The pattern in which the high refractive index particles are dispersed in the material having the relatively small refractive index may cause the scattering of light by, for example, mixing the high refractive index particles that are dispersed while the particles are not agglomerated with monomers, polymers, or the mixtures of the polymers and the monomers, filling them in the light reuse pattern, removing the solvent, and if necessary, and forming it through the curing of UV or heat curing.

In the case of when the light reuse pattern is formed by mixing two or more components to more components having different refractive indexs, for example, the mixture that includes titanium oxides may be used. The titanium oxide may change the refractive index in accordance with the synthesis method, and the shape thereof may be sphere or nonshpere. Accordingly, the scattering may be introduced by mixing the titanium oxides having the high refractive index and the material having the refractive index that is lower than that of the titanium oxide with each other. In addition, since the magnesium fluoride particles have the low refractive index (n=1.38), the light reuse pattern may be formed in a scattering pattern by mixing the magnesium fluoride particles and the material having the refractive index that is higher than that of the magnesium fluoride particles with each other. The above-mentioned method for forming the scattering pattern is only set forth to illustrate the present invention, and various methods for forming the scattering pattern may be used. The methods for causing the scattering have extensively been used in diffusers that serve to uniformly diffuse light emitted from the backlight of LCD or antireflection coating that prevents the reflection of the light source around the surface of the display, and these technologies may be applied to the present invention.

In addition, the light reuse pattern may serve to reuse light that is total reflected by including the material that absorbs light that is total reflected and re-emits light in all directions. In this case, since light may be reused, and the light reuse pattern absorbs light emitted from the light emitting layer and then re-emits light having the another wavelength, a desired color may be implemented by the sum total of the wavelength emitted from the light emitting layer and the wavelength re-emitted from the light reuse pattern.

Unlike the method for reusing light that is total reflected by the scattering, in order to absorb light that is total reflected and re-emit the light, the light reuse pattern may include a fluorescent or phosphorescent material. The light that is total reflected enters the light reuse pattern within a predetermined angle range in respets to the flat surface of the substrate. At this time, in the case of when there is not the light reuse pattern, most of light is absorbed by the device and thus converted into heat during the total reflection process. However, the light that is total reflected is absorbed into the fluorescent or phosphorescent material, and the absorbed light re-emits light having the longer wavelength than that of incident light. At this time, the re-emitted light is total reflected, and re-emitted in all directions unlike light that is incident to the light reuse pattern at a predetermined angle. Accordingly, a great quantity of light is emitted to the outside of the substrate again, such that efficiency of the device may be increased.

In the present invention, the path of light in accordance with the presence of the light reuse pattern will be described by using the structure of FIG. 6 as an example thereof. If an electric field is applied to the device of the structure illustrated in FIG. 6, as shown in FIG. 11, an electric charge is injected to only a portion where the anode and the cathode are simultaneously present, and light is emitted while injected electric charge constitutes recombination. At this time, light that is generated at an angle forming total reflection at the interface between the transparent substrate 1 having the relatively low refractive index and the high refractive layer 5 having the relatively high refractive index reaches the light reuse patterns 6 and 7 as shown in FIG. 12. The light reuse pattern serves to emit light to the outside by changing the angle of light traveling after the total reflection at the interface between the transparent substrate and the transparent electrode.

In order to absorb and re-emit light by the light reuse pattern, after the light reuse pattern is emitted from the light emitting layer of the organic light emitting device, it should be total reflected and absorb light, and it is preferable that efficiency of the absorbed light is high. Therefore, it is preferable that the long wavelength area of the spectrum of light that is generated in the light emitting layer and at least a portion of the short wavelength area of the spectrum of the light reuse pattern material overlap each other. In addition, in the case of when the fluorescent or phosphorescent material of the light reuse pattern absorbs one photon, it is preferable that it has an ability of re-emitting at least 0.2 or more photons, and it is more preferable that it has an ability of re-emitting at least 0.5 or more photons. To this end, the light reuse pattern should include one or more fluorescent or phosphorescent materials, and the materials having this property may be selected from the organic material or the inorganic material.

As the organic material having the above property, there are materials such as a rubrene-based material, a thiophene-based material, an imidazole-based material, a coumarine-based material, an oxazole-based material, a thiazole-based material and the like, and there are organic compounds including anthracene, tetracene, petacene and the like and derivatives thereof, but these are illustrative but the scope of the present invention is not limited to the examples thereof. The organic materials having the above property have been extensively used for the purpose such as known brighteners, laser dyes or light emitting hosts or light emitting dopants of the organic light emitting devices, and in the present invention, they may be directly used or may be used while being converted into derivatives having the structure useful for the purpose of the present invention.

As the fluorescent or phosphorescent material that constitutes the light reuse pattern, inorganic materials may be used in addition to the above-mentioned organic material. The inorganic fluorescent or phosphorescent material emits light in the light emitting layer and then absorbs light that is not emitted to the outside of the device and total reflects light to absorb light entering into the light reuse pattern and re-emit light. Therefore, the used inorganic fluorescent or phosphorescent material should absorb the wavelength of light emitted in the light emitting layer, and it is preferable that after the material absorbs light, the material is selected from materials that have the high proton efficiency and can re-emit light at high efficiency. Silicate compounds that are doped with europium such as $SrGa_2S_4:Eu$, $Y_3Al_5O_{12}:Ce$, $(Y,Gd)_3Al_5O_{12}:Ce$, $Gd_3Al_5O_{12}:Ce$, $CaS:Ce^{3+}$, $Na^+$, $CaS:Eu^{2+}$, $Ce^{3+}$, $ZnS:Te$, $Mn$, $ZnS:Se$, $Te$, $Mn$, $ZnS:Ce$, $Li$, $ZnS:Cu, Al$, $(Sr, Ca, Ba, Mg)_{10}(PO_4)_6Cl_2:Eu^{2+}$, $Y_2O_2S:Eu^{3+}$ or $Li_2SrSiO_4:Eu^{2+}$, $Ba_9Sc_2Si_6O_{24}:Eu^{2+}$, $Ca_3Si_2O_7:Eu^{2+}$, and $Ba_2MgSi_2O_7:Eu^{2+}$ may be used. However, they are set forth to illustrate the present invention, but the scope of the present invention is not limited thereto.

In the present invention, as the inorganic fluorescent or phosphorescent material having the above property, a known inorganic fluorescent or phosphorescent material such as PDP (plasma display panel), LED (Light emitting diode), and CCFL (cold cathode fluorescent lamp) that absorbs light having the short wavelength and emits visible rays and has been used in technologies used as flat panel displays or lighting sources may be used, or an inorganic fluorescent or phosphorescent material that has a modified structure that is capable of more efficiently absorbing light emitted in the light emitting layer and emitting light may be used. In addition, as the phosphorescent body, a phosphorescent body that is used in a technology constituting a light emitting layer as a phosphorescent material in the organic light emitting device may be used. In general, the phosphorescent dopants may include atoms such as iridium (Ir) or platinum (Pt) or europium (Eu) and the like. In addition, materials such as ZnS, ZnSe and the like are formed in a nano size, and a nano-sized fluorescent body having different light emitting wavelengths depending on the size thereof may be used.

In the present invention, the organic material or inorganic material having the fluorescent or phosphorescent property may be used alone to form the light reuse pattern. However, the light reuse pattern may be formed by mixing the organic material or inorganic material having the fluorescent or phosphorescent property with other polymers. One of the purposes of mixing the material with the other polymers is to provide good position stability and dimensional stability to the position of the light reuse pattern. The fluorescent or phosphorescent material may be filled at the desired position of the light reuse pattern by mixing the fluorescent or phosphorescent material with the polymer having the viscosity that is higher than that of the fluorescent or phosphorescent material and using it. At this time, after the used polymer forms the light reuse pattern, the crosslinking reaction may be carried out by UV or heat curing. This crosslinking reaction may increase stability to the solvent of the light reuse pattern, the positional stability, the dimensional stability, and heat stability.

Instead of using the polymer, after the fluorescent or phosphorescent organic material or the inorganic material and the monomer type of material are mixed with each other, it is possible to polymerize the monomers through heat curing or photo-curing. In addition, the polymer that has the fluorescent or phosphorescent property may be used as the material constituting the light reuse pattern.

In general, in order to form the light reuse pattern that includes the fluorescent or phosphorescent material, the fluorescent or phosphorescent material may be used alone or the material is mixed with the polymer or the monomer and coated or printed to form the pattern. If necessary, the layer may be formed by using a deposition process. For example, methods such as screen printing, roll printing offset printing, inkjet printing and the like may be applied, and a photolithography process may be used according to the purpose. In order to perform the printing process or the photolithography process, a polymer having an appropriate viscosity may be mixed therewith.

In the present invention, in the case of when the light reuse pattern includes the fluorescent or phosphorescent material, one kind of fluorescent or phosphorescent material may be used, and if necessary, two or more kinds of fluorescent or phosphorescent materials having different light emitting wavelengths may be used. At this time, two or more kinds of fluorescent or phosphorescent materials may be included in one light reuse pattern, or two or more of light reuse patterns may be formed into different fluorescent or phosphorescent materials. In the case of when two or more of different fluorescent or phosphorescent materials are used, the light reuse pattern may emit light having different two wavelengths by two or more kinds of fluorescent or phosphorescent materials, or a desired color may be implemented by the sum total of the above wavelengths and the wavelengths of light emitted in the light emitting layer. In this case, in the case of when the same fluorescent or phosphorescent material is included in the light reuse pattern, since wide spectrum light emitted from two or more kinds of fluorescent or phosphorescent materials may be obtained from each pattern, a desired color may be obtained by selecting an appropriate fluorescent or phosphorescent material and controlling an appropriate ratio thereof.

In the present invention, in the case of when the light reuse pattern includes the material that absorbs total reflected light and re-emits light, it is preferable that the organic light emitting device according to the present invention further includes a light scattering pattern. For example, at least a portion of the light reuse pattern may be a scattering pattern. As described above, since it further includes the light scattering pattern, it is possible to maximize efficiency of light absorbed by the light reuse pattern and re-emitted.

In the present invention, the light reuse pattern may be a low refractive index pattern. It is preferable that the low refractive index pattern is a layer that includes the light reuse pattern, for example, a layer that has the refractive index that is lower than that of the high refractive index layer or electrode. In detail, the low refractive index pattern is a layer that includes the low refractive index pattern, that is, the refractive index is smaller than the refractive index of the high refractive index layer or electrode preferably by 0.05 or more, and more preferably by 0.1 or more. Since the light reuse pattern is configured by the pattern having the low refractive index, a traveling direction of light may be changed so that light incident to the light reuse pattern is easily emitted to the outside of the device. A change in path of light by the pattern having the low refractive index is illustrated in FIG. 13. The refractive index of the low refractive index pattern is preferably 1.6 or less and more preferably 1.3 to 1.55.

In the case of when the low refractive index pattern is included in the organic material layer in the device such as the light emitting layer, since it is very difficult to manufacture the device, or there is a very high possibility of formation of impurities such as particles, stability of the device is largely lowered, thereby negatively affecting the driving of the device. However, in the present invention, since the above-mentioned low refractive index pattern is provided to the outside of the electrode, it is possible to easily manufacture the device, and a possibility of formation of impurities is very small. Accordingly, emission efficiency of light may be maximized while not affecting stability of the device.

In the present invention, the light reuse pattern includes a reflective material, light may be reused by reflecting light total reflected. At this time, the reflective material may be formed of aluminium, silver, or a mixture or alloy including them. The light reuse pattern may be formed of only the reflective material, and the light reuse pattern may have a structure in which reflective material particles are dispersed in a polymer material. In addition, the circumference of the light reuse pattern or the interface between the light reuse pattern and the high refractive index layer is formed of the reflective material, and the residual portion may be made of the other materials. In the case of when the only circumference of the light reuse pattern is formed of the reflective material, the kind of inner material is not particularly limited. It is preferable that the angle $\theta$ between the light reuse pattern that includes the reflective material and the substrate is in the range of 30 to 60°.

In the present invention, light that is generated at an angle of extracting light to the outside may be directly extracted to the outside while only light that is total reflected therein is reused by controlling the ratio of the portion that is patterned with the light reuse pattern and the non-patterned portion or optimizing the height of the light reuse pattern, such that the selective reusing of light may be maximized.

As described above, when emission efficiency of light is increased by scattering total reflected light, absorbing and re-emitting light by the fluorescent or phosphorescent material, refracting light by using a difference in refractive index, and reflecting light, preferable dimension required in the device in order to maximize the increase efficiency is illustrated in FIG. 14. The thickness of the high refractive index layer 5 is preferably 0.2 micrometers or more and more preferably 0.5 micrometers or more. In FIG. 14, the layer that includes the light reuse pattern, which is divided by the light reuse pattern 6 and the light reuse pattern 7, that is, in the first embodiment, the preferable width c of the high refractive index layer 5 relates to the height a of the high refractive index layer 5. For example, in the case of when the ratio of the height a of the high refractive index layer 5 and the width c of the high refractive index layer 5 that is divided by the light reuse pattern is 1:1, 1:10, and 1:100, the number of total reflection is increased to 1:10:100 in a predetermined section until light that is total reflected at a predetermined angle from a predetermined light emitting site existing in the light emitting layer 3 reaches the light reuse pattern 6 or light reuse pattern 7. Therefore, in the case of when the ratio of a/c decreases at the fixed a value, the absorption of light by the electrode and the absorption of light by the organic material are continuously increased, and thus, the quantity of light that is total reflected and reaches the light reuse patterns 6 and 7 decreases. Since the pixel size (length) for natural color moving picture displays that are generally used is in the range of about 200 to 300 micrometers, in a general organic light emitting device, if the size of the pixel for displays is the size of the high refractive index layer 5, since the sum total of the thicknesses of the organic material layer generally used and the first electrode is 0.4 micrometers or less, in this case, the maximum value of the ratio of a:c is 0.00133. Therefore, even though the light reuse patterns 6 and 7 are separately manufactured beside each pixel, before light that is total reflected reaches the light reuse patterns 6 and 7, most of light is absorbed by the electrode or the organic material layer and converted into heat. Accordingly, in order to obtain an efficiency increase required in the present invention, the ratio of a:c is preferably 0.01 or more and more preferably 0.05 or more. It is preferable that the ratio of a:c is 1 or less.

The preferable size of the light reuse patterns 6 and 7 that serve to scatter or absorb light that is total reflected from the light emitting layer 3 and enters into the light reuse patterns 6 and 7 and re-emit light relates to the layer that includes the light reuse pattern, which is divided by the light reuse pattern 6 and the light reuse pattern 7, that is, in the first embodiment, the width c of the high refractive index layer 5. In the case of when the widths b and d of the light reuse pattern are larger than the width c of the high refractive index layer 5 that is positioned between the light reuse patterns 6 and 7, light that is emitted from the light emitting layer 3, total reflected, and enters thereinto is sufficiently absorbed/re-emitted, scattered, refracted, and reflected. However, the area ratio of the portion that emits light by application of current in a predetermined area is relatively lowered. Therefore, efficiency of the device is increased at a predetermined current concentration while the quantity of current applied to the electrode layer per unit area may be relatively increased in order to obtain a predetermined illumination. Accordingly, the value of b/c or d/c is preferably less than 2, more preferably less than 0.5, and more preferably less than 0.2. In addition, it is preferable that the value of b/c or d/c is larger than 0.005.

In the present invention, in the case of when the light reuse pattern forms a scattering pattern, a pattern that includes a fluorescent or phosphorescent material, or a high refractive index pattern, light that is total reflected may be extracted to the outside by forming the interface between the light reuse pattern and the high refractive index layer using the reflective material. An effort for increasing efficiency by using a reflection plate having a predetermined angle in respects to the substrate has been made (U.S. Pat. No. 6,650,045, but as described in the present invention, an effort for increasing light emitting efficiency by introducing the reflective material into the high refractive index layer or the electrode as described later to reduce the number of total reflection is made first by the present invention. To this end, as the reflective material that is capable of being used at the interface between the light reuse patterns 6 and 7 and the high refractive index layer, aluminium, silver, or a mixture or alloy including them may be used. The interface made of the reflective material may be formed through methods such as a deposition process, electroless plating and the like. The path of light at the interface that is formed by using the reflective material is illustrated in FIG. 15. At this time, it is preferable that the angle θ of the interface to the substrate is in the range of 30 to 60°.

In the present invention, the refractive index of the high refractive index layer is higher than the refractive index of the material that constitutes the substrate. Since the refractive index of the glass substrate is 1.55, the refractive index of the preferable high refractive index layer is 1.6 or more. The upper limit of the refractive index of the high refractive index layer is not particularly limited, but it is preferable that it is 4 or less. It is more preferable that the refractive index of the high refractive index layer is in the range of 1.65 to 1.9. In addition, in the case of when the refractive index of the high refractive index layer is the same as or higher than the refractive index of the first electrode, when photon that is emitted from the organic material layer enters through the first electrode into the high refractive index layer, since there is no total reflection at the interface, it is possible to efficiently manufacture the device. Since the refractive index of the electrode on the basis of indium oxides such as ITO or IZO that are generally used transparent electrode is changed from 1.7 to 2.2 according to the kind, concentration and process condition of the doping material, it is more preferable that the refractive index of the high refractive index layer is 1.65 or more.

In addition, it is preferable that the high refractive index layer has excellent light transmissivity. In the case of when the light transmissivity is low, before light that is total reflected reaches the light reuse pattern, light is absorbed by the high refractive index layer and converted into heat, such that the light transmissivity of the high refractive index layer is preferably 50% or more, more preferably 80% or more, and more preferably 90% or more. At this time, the light transmissivity means transmissivity at a visible ray area, and in particular, it is preferable that the transmissivity to the wavelength emitted in the light emitting layer by recombination of electrons and holes is 50% or more.

The material of the high refractive index layer that satisfies the above conditions may be selected from materials that includes oxides, nitrides, oxynitrides of silicon, titanium, zirconium, molybdenum and the like. The above high refractive index layer materials may be manufactured by a thin film forming process under vacuum.

In addition, the high refractive index layer may be formed by mixing material particles that have high refractive index and the size not scattering light with the polymer or the polymer precursor and coating it on the substrate.

If the particle size is similar to the wavelength of visible rays or larger than the wavelength of visible rays, since scattering of light occurs, it is preferable that the particles having the high refractive index and an appropriate size are selected. That is, it is preferable that the particle size is smaller than the wavelength of visible rays. The high refractive index layer may be formed of only polymer material. In addition, after coated on the substrate by using the material precursor having the high refractive index, the precursor is converted into the material having the high refractive index by applying heat, such that high refractive layer may be obtained in conjunction with improvement in processability. The material of the above high refractive index layer is set forth to illustrate the present invention, and may be selected from various material groups that are capable of satisfying the refractive index and the transmissivity.

In the case of when the polymer or the mixture having the high refractive index is used as the high refractive index layer, a wet coating method may be used instead of a deposition method. In the case of when the wet method is used, as compared to the use of the vacuum deposition method, mechanical stress acts between the substrate and the layer as the thickness of the high refractive index layer is increased, such that it is easy to prevent the substrate from being deformed.

The high refractive index layer may be formed of a single layer, but if necessary, may have a multilayered structure under a state satisfying the transmissivity. The high refractive index layer that has the multilayered structure is advantageous in that deterioration of the film due to stress caused by a difference in mechanical or thermal properties generated in the structure that includes the substrate 1 and the high refractive index layer 5 of the single layer, that is, a difference in thermal expansion coefficient and the like may be reduced. Since the organic light emitting device that includes the first electrode should be constituted on the upper portion of the high refractive index layer, the multilayered structure may be formed in order to more increase the flatness of the high refractive index layer. The thickness of the high refractive index layer 5 is preferably 0.2 micrometers or more and more preferably 0.5 micrometers or more. In addition, the thickness of the high refractive index layer 5 may be 2 mm or less. The thickness of the light reuse pattern is preferably ⅒ or more and more preferably ⅕ or more of the thickness of the high refractive index layer.

The organic light emitting device according to the first embodiment of the present invention further includes a first electrode, an organic material layer and a second electrode on the high refractive index layer. As shown in FIGS. 3 to 8, the organic material layer 3 may be formed in a single layer, but if necessary, it may have a multilayered structure that further includes at least one layer of a hole injection layer, a hole transport layer, an electron obstruction layer, a hole obstruction layer and an electron transport layer in addition to the light emitting layer.

In addition, the organic light emitting device may be a single layer organic light emitting device that includes one light emitting unit including the light emitting layer between the first electrode and the second electrode, or an organic light emitting device that has a stack structure including two or more light emitting units including the light emitting layer. As described above, since the organic light emitting device having the stack structure includes a structure in which two or more light emitting units of a single layer or multilayers including the light emitting layer are layered, the quantity of light generated may be increased by two or three times while the quantity of current applied to the device is not changed. The organic light emitting device having the stack structure may include an intermediate conductive layer or an electric charge generating layer between the light emitting units. In the case of when there is not intermediate conductive layer serving as the electrode, when current is applied thereto, the electric charge generating layer provides a structure that generates an electric charge between the light emitting units.

FIGS. 16 and 17 illustrate an organic light emitting device that has a stack structure in which an organic light emitting unit 3 and a second organic light emitting unit 9 are layered between the first electrode 2 and a second electrode 4, and the intermediate conductive layer or the electric charge generating layer 8 is provided between the organic light emitting units 3 and 9. Two or more of light emitting units may have the same material or structure, or different materials or structure. Herein, the organic light emitting units 3 and 9 may be formed in a single layer, but if necessary, may have a multilayered structure that further includes at least one layer of a hole injection layer, a hole transport layer, an electron obstruction layer, a hole obstruction layer and an electron transport layer in addition to the light emitting layer.

For example, each light emitting unit may be made of the same light emitting material or different light emitting materials. For example, in the case of when the organic light emitting unit 3 contains a blue light emitting material, and the organic light emitting unit 9 contains a green light emitting material, light that is emitted in the device shows a blue color having a long wavelength that includes all wavelengths of lights emitted from the organic light emitting unit 3 and the organic light emitting unit 9. In addition, as described above, white light may be realized by controlling colors of emitted light of the layered light emitting units. In addition, in the case of when the organic light emitting unit 3 and the organic light emitting unit 9 that constitutes each light emitting unit is made of the same light emitting material, as compared to the device that includes only one light emitting unit, light emitting efficiency may be increased up to two times at the same applied current.

Reference numeral 8 of FIGS. 16 and 17 represents an intermediate conductive layer or an electric charge generating layer that is provided between the light emitting units, and in the case of when the electric charge generating layer is provided, electric charge may be generated between the layers without a separate intermediate electrode.

The second electrode may be formed by using the electrode material that is generally used in the art. In the case of when the first electrode is the anode, the second electrode may serve as the cathode, and in the case of when the first electrode is the cathode, the second electrode may serve as the anode. The second electrode may be made of the light transmissive material, or a light reflective material. The material of the second electrode may be selected from the materials that are mentioned as the material of the first electrode.

In the present invention, a conductive layer that is positioned between the first electrode and organic material layer or between the light reuse pattern and organic material layer and contacted with the first electrode may be further provided.

When the electric conductivity of the first electrode is not sufficient, the conductive layer serves to uniformly supply current supplied from a power source to the first electrode layer. It is preferable that the electric resistance of the conductive layer is $10^{-6}$ Ωm or less. As the material of the conductive layer, aluminium (Al), copper (Cu), molybdenum (Mo), silver (Ag), gold (Au), platinum (Pt), chrome (Cr), nickel (Ni), zinc (Zn), indium (In) and the like may be used and an alloy that includes them as a main component may be used. It is preferable that the thickness of the conductive layer is in the range of 2 to 2000 nanometers. The conductive layer may be formed in a pattern form, and at this time, it is preferable that the patterned area is 30% or less of the area of the first electrode. In addition, in the case of when the conductive layer is formed in a pattern form, the thickness thereof is in the range of preferably 0.1 micrometer to 1,000 micrometer and more preferably 0.3 micrometer to 0.5 micrometer. If the thickness of the conductive layer is excessive thin, it is difficult to contribute to an increase in electric conductivity, and if it is excessive thick, it is difficult to form the layers including the organic material layer at the upper portion thereof.

The organic light emitting device according to the first embodiment of the present invention may be manufactured by using a method for manufacturing an organic light emitting device, which includes the steps of forming a first electrode on a substrate, forming an organic material layer including the light emitting layer on the first electrode, and forming a second electrode on the organic material layer, the method comprising the steps of: (a) before the first electrode is formed, forming a patterned high refractive index layer on a substrate and forming a light reuse pattern on the patterned portion; (b) after the high refractive index layer and first electrode are patterned and formed on the substrate, forming the light reuse pattern on the patterned portion; or (c) before the first electrode is formed, forming the light reuse pattern on the substrate and forming the high refractive index layer on the side on which the light reuse pattern of the substrate is formed. As described above, after the light reuse layer and high refractive index layer are formed, the residual layers of the device are sequentially formed.

In the present invention, as the shape of the light reuse pattern, the shape of the light reuse pattern in a cross-section viewed from the upper portion of the substrate of the organic light emitting device may be, for example, as shown in FIG. 20, a straight valley shape, or a lattice shape as shown in FIG. 21 (reference numeral 5: high refractive index layer, reference numeral 6 and 7: light reuse pattern). However, these drawings are set forth to illustrate the present invention, but the scope of the present invention is not limited thereto.

In the case of when the step (a) or (b) is used, as the method for patterning the high refractive index layer or the high refractive index layer and the first electrode, dry etching or wet etching that is generally used in manufacturing of semiconductors or liquid crystal displays may be used. In particular, the dry etching method is a method that is capable of performing patterning by using a plasma and gas. In respects to the method for forming the light reuse pattern, the method is described in the description relating to the light reuse pattern.

After the high refractive index layer or electrode is formed, the high refractive index layer or electrode may be directly formed in a patterned form instead of performing the pattering.

In the case of the high refractive index layer, by controlling viscosity in an appropriate value by using the high refractive index material having the solubility to the solvent or the dispersibility, the patterned high refractive index layer may be directly formed by using methods such as inkjet printing, roll printing screen printing, offset printing and the like.

As the method for forming the light reuse pattern on the patterned high refractive index layer or first electrode, coating or printing method may be used, and if necessary, a deposition process may be used. For example, the methods such as screen printing, roll printing, offset printing, inkjet printing, and the like may be used, and a photolithography or laser transfer method may be used for the purpose thereof. In order to perform the printing process or the photolithography process, polymers having an appropriate viscosity may be mixed.

In the present invention, when the light reuse pattern is formed, since various methods such as the printing method and the like may be used, it is possible to easily perform the manufacturing method and to reduce the process cost.

An example of the method for manufacturing the organic light emitting device according to the present invention including the step (b) is illustrated in FIG. 18, but the scope of the present invention is not limited thereto.

In the case of when the step (c) is used, when the light reuse pattern is directly formed on the substrate, methods that are known in the art such as printing processes such as screen printing, roll printing, offset printing, inkjet printing, and the like, the photolithography process and the like may be used. Subsequently, the high refractive index layer or electrode may be formed on the light reuse pattern that is formed on the substrate to have the height that is the same as or higher than the height of the light reuse pattern.

After the light reuse pattern is formed, when the high refractive index layer is formed, a printing method, a solution casting method, an extrusion, film laminating method and the like may be used. At this time, the high refractive index layer may be formed so as to make the upper side thereof flat, but the upper side thereof may not be flat because of the protrusion of the light reuse pattern. As described above, in the case of when the device including the electrode is formed while the non-flat structure is maintained on the non-flat surface upper portion, it does not largely affect performance of the device. However, when the electrode is formed on the non-flat surface of the high refractive index layer, the surface may be made flat or it may be made flat by coating a separate layer. For example, additional high refractive index layer may be coated on the high refractive index layer. The additional high refractive index layer may improve adhesion strength with the electrode formed thereon, and may serve to make the non-flat surface flat.

In addition, the high refractive index layer may be formed by coating material particles having the high refractive index and the size not scattering light on the substrate while being mixed with polymers or polymer precursors. If the size of the particle is similar to or larger than the wavelength of visible rays, since scattering of light occurs, it is preferable that the particle having the high refractive index and the appropriate size is selected. That is, it is preferable that the size of the particle is smaller than the wavelength of the visible rays. The high refractive index layer may be formed of only the polymer material. In addition, after the coating using the precursor of the material having the high refractive index on the substrate, heat is applied to convert the precursor into the material having the high refraction, such that the high refractive layer may be obtained while the processability is improved. The material of the above high refractive index layer is set forth to illustrate the present invention, but it may be selected from various material groups capable of satisfying the refractive index and the transmissivity.

In the present invention, in the case of when the high refractive index layer is formed by using the wet coating, the polymer or the mixture having the high refractive index may be used. As described above, in the case of when the thickness of the high refractive index layer is increased, the wet method does not cause deformation of the substrate due to mechanical stress in respects to the substrate.

An example of the method for manufacturing the organic light emitting device according to the present invention, which includes the step (c), is illustrated in FIG. 19, but the scope of the present invention is not limited thereto.

A second embodiment of the present invention provides an organic light emitting device that includes a substrate, a first electrode that is positioned on the substrate, one or more layers of organic material layers including a light emitting layer positioned on the first electrode, and a second electrode that is positioned on the organic material layer, wherein the second electrode has the light transmissivity property, a high refractive index layer is positioned in sides in an organic material layer direction and an opposite direction of the second electrode, and the high refractive index layer includes a light reuse pattern. FIG. 22 illustrates the second embodiment.

A layer that includes the fluorescent or phosphorescent material may be further provided on the outer surface of the organic light emitting device according to the present invention, for example, a side that is opposite to the side contacting with the first electrode of the substrate or an upper portion of the second electrode. Emission efficiency of light that is emitted from the light emitting layer is increased or the color of emitted light may be controlled by the additional layer.

The organic light emitting device according to the second embodiment is characterized in that the second electrode has the light transmissivity property and the device is provided with the high refractive index layer including the light reuse pattern on the second electrode side through which light passes, thereby improving light extraction efficiency. In this case, the first electrode may have the light transmissivity property. As described above, the description of remaining constitutions is the same as that of the first embodiment, except that the position of the high refractive index layer including the light reuse pattern is different. However, the refractive index of the high refractive index layer is 1.6 or more and more preferably 1.65 or more on the basis of the refractive index of the general glass substrate.

In addition, the present invention provides an organic light emitting device that includes a substrate, a first electrode that is positioned on the substrate, one or more layers of organic material layers including a light emitting layer positioned on the first electrode, and a second electrode that is positioned on the organic material layer, wherein at least one of the first electrode and the second electrode includes the light reuse pattern, the electrode including the light reuse pattern has the light transmissivity property. Hereinafter, embodiments of the present invention will be described.

A third embodiment of the present invention provides an organic light emitting device that includes a substrate, a first electrode that is positioned on the substrate, one or more layers of organic material layers including a light emitting layer positioned on the first electrode, and a second electrode that is positioned on the organic material layer, wherein the substrate and the first electrode have the light transmissivity property, and the first electrode includes the light reuse pattern. FIG. 23 illustrates the third embodiment.

The organic light emitting device according to the third embodiment does not have the high refractive index layer, and the light reuse pattern is provided in the first electrode. In this case, the second electrode may have the light transmissivity property. As described above, the description of remaining constitutions is the same as that of the first embodiment, except that it does not include the high refractive index layer and the light reuse pattern is provided in the first electrode. Herein, the description of the dimension of the high refractive index layer and light reuse pattern of the first embodiment may be applied to the dimension of the first electrode and light reuse pattern of the third embodiment.

In the third embodiment, it is preferable that the material of the first electrode has the higher refractive index than that of the substrate. The refractive index of the first electrode is 1.6 or more and preferably 1.65 or more. In order to control the refractive index of the first electrode, if necessary, a dopant may be added to the first electrode.

A fourth embodiment of the present invention provides an organic light emitting device that includes a substrate, a first electrode that is positioned on the substrate, one or more layers of organic material layers including a light emitting layer positioned on the first electrode, and a second electrode that is positioned on the organic material layer, wherein the second electrode have the light transmissivity property, and the second electrode includes the light reuse pattern. FIG. 24 illustrates the fourth embodiment.

The organic light emitting device according to the fourth embodiment is characterized in that the second electrode has the light transmissivity property and the device is provided with the light reuse pattern in the second electrode side through which light passes, thereby improving light extraction efficiency. In this case, the first electrode also may have the light transmissivity property. As described above, the description of remaining constitutions is the same as that of the third embodiment, except that the position of the light reuse pattern is different. The refractive index of the second electrode is 1.6 or more and more preferably 1.65 or more.

The invention claimed is:

1. An organic light emitting device comprising:
   a substrate having light transmissivity;
   a first electrode that is disposed on the substrate;
   one or more organic material layers that include a light emitting layer disposed on the first electrode;
   a second electrode that is disposed on the organic material layer; and
   a high refractive index layer that is provided on at least one side of a lower portion of the first electrode and an upper portion of the second electrode,
   wherein the high refractive index layer includes a light reuse pattern therein, wherein the light reuse pattern is uniformly distributed in a horizontal direction of the high refractive index layer, such that the high refractive index layer is divided by the light reuse pattern,
   wherein the light reuse pattern comprises first and second disconnected segments,
   wherein a first material of the first disconnected segment is the same as, or different from, a second material of the second disconnected segment, and wherein the first and second materials are different from a material of the high refractive index layer, and wherein the first and second disconnected segments of the light reuse pattern are separated by a portion of the high refractive index layer present between the first and second disconnected segments, such that the first and second disconnected segments are not in contact with each other,
   wherein an interface between the light reuse pattern and the high refractive index layer is vertical or inclined with respect to a surface of the substrate,
   wherein the light reuse pattern has at least one function selected from scattering, absorption, and re-emission, light refraction and reflection, and
   wherein ratio a:c is 0.01 or more, "a" being a thickness of the high refractive index layer including the light reuse pattern in a direction perpendicular to the substrate, and "c" being an average width, measured parallel to the substrate, of the portion of the high refractive index layer that is present between the first and second materials of the light reuse pattern.

2. The organic light emitting device as set forth in claim 1, wherein the first electrode has light transmissivity, and the high refractive index layer is provided between the substrate and the first electrode.

3. The organic light emitting device as set forth in claim 1, wherein the second electrode has light transmissivity, and the high refractive index layer is provided on a side that is opposite to the organic material layer of the second electrode.

4. The organic light emitting device as set forth in claim 1, wherein the function of the light reuse pattern is scattering.

5. The organic light emitting device as set forth in claim 1, wherein the function of the light reuse pattern is absorption, and remission.

6. The organic light emitting device as set forth in claim 1, wherein the first or second material, or both, of the disconnected segments of the light reuse pattern is a low refractive index material.

7. The organic light emitting device as set forth in claim 6, wherein the refractive index of the low refractive index material is 1.6 or less.

8. The organic light emitting device as set forth in claim 1, wherein the function of the light reuse pattern is reflection.

9. The organic light emitting device as set forth in claim 1, wherein the thickness of the light reuse pattern is 20 to 90% of a thickness of the high refractive index layer.

10. The organic light emitting device as set forth in claim 1, wherein a patterned area of the light reuse pattern is 5 to 90% of the entire area.

11. The organic light emitting device as set forth in claim 1, wherein the refractive index of the high refractive index layer is 1.6 or more.

12. The organic light emitting device as set forth in claim 11, wherein the refractive index of the high refractive index layer is in the range of 1.65 to 1.9.

13. The organic light emitting device as set forth in claim 1, wherein the light transmissivity of the high refractive index layer is 80% or more.

14. The organic light emitting device as set forth in claim 1, wherein the ratio b/c of the width b of the light reuse pattern and width c of the high refractive index layer that is divided by the light reuse pattern is less than 2.

15. The organic light emitting device as set forth in claim 1, wherein a circumference of the light reuse pattern or the interface between the light reuse pattern and the high refractive index layer is a reflective material.

16. The organic light emitting device as set forth in claim 1, further comprising a conductive layer positioned between the first electrode and the organic material layer or between the light reuse pattern and the organic material layer and in contact with the first electrode.

17. The organic light emitting device as set forth in claim 1, further comprising a layer that includes a fluorescent or phosphorescent material on an outer surface of the organic light emitting device.

\* \* \* \* \*